(12) United States Patent
Le

(10) Patent No.: US 6,798,273 B2
(45) Date of Patent: Sep. 28, 2004

(54) LINEAR POWER CONVERSION CIRCUIT

(75) Inventor: Luan Le, Cormelles-le-Royal (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 20 days.

(21) Appl. No.: 10/247,921

(22) Filed: Sep. 20, 2002

(65) Prior Publication Data

US 2003/0076080 A1 Apr. 24, 2003

(30) Foreign Application Priority Data

Sep. 25, 2001 (FR) .............................................. 01 12323

(51) Int. Cl.[7] .................................................. G06G 7/12
(52) U.S. Cl. ......................... 327/530; 327/355; 327/563
(58) Field of Search ................................ 327/355, 356, 327/357, 358, 359, 530, 534, 535, 538, 540, 543, 561, 562, 563

(56) References Cited

U.S. PATENT DOCUMENTS

| 6,021,323 A | 2/2000 | Vagher ......................... 455/324 |
| 6,122,497 A | 9/2000 | Gilbert ......................... 455/333 |

FOREIGN PATENT DOCUMENTS

| EP | 0316999 A1 | 11/1988 | ............ H03D/7/14 |
| EP | 0565299 A1 | 3/1993 | ............ H03D/7/14 |
| EP | 0942526 A1 | 3/1999 | ............ H03F/3/56 |
| WO | WO9315560 | 1/1993 | ............ H04B/1/26 |

*Primary Examiner*—Jeffrey Zweizig
(74) *Attorney, Agent, or Firm*—Aaron Waxlor

(57) ABSTRACT

The invention relates to a conversion circuit to convert a differential power signal II[1], II[2] into a differential output current IC[1], IC[2], said circuit including conversion means CONV and regulation means REG for the input impedance of the circuit connected to the conversion means CONV. The regulation means REG according to the invention include negative feedback means to control a regulating current IREG taken from each component of the power signal II[1], II[2] as a function of the values of the potentials V[1], V[2] at the inputs of the conversion circuit. The half-sum between the two potentials V[1], V[2] at the inputs of the circuit is advantageously used to guide the negative feedback which can advantageously be applied to the bases of the regulation transistors controlling the value of the regulating current.

The invention permits mixers of great precision to be produced and can be used in any signal processing apparatus using power conversion circuits and, in particular, mixers.

9 Claims, 5 Drawing Sheets

LINEAR POWER CONVERSION CIRCUIT

The invention relates to a conversion circuit for converting a differential power signal composed of a first signal supplied on a first common node and a second signal supplied on a second common node, into a differential output current composed of a first and a second current, said circuit having a first output supplying the first current and a second output supplying the second current, said circuit including:
- conversion means for converting the first and second signal into the first and second current respectively, said conversion means being connected to the first and second outputs of the conversion circuit,
- regulation means for regulating the input impedance of the circuit, which regulation means are connected to the conversion means.

The invention also relates to the domain of mixers and more generally the domain of analog signal processing circuits.

Figure 1:
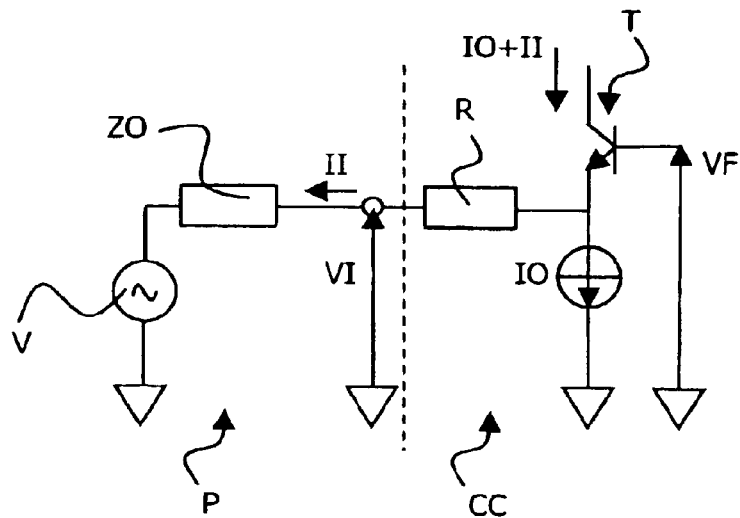

The simplest cell for converting a signal into current uses a transistor subjected to biasing and a resistance, as represented in FIG. 1. The main limitation is that, whatever the type of transistor used, the input impedance rises sharply when the current in the transistor diminishes. This is the case when the absolute value of II is near the value of the bias current IO, which occurs with high power. In this case an a.c. signal will not benefit from constant impedance during conversion, negative values seeing higher impedance than positive values in this time. A costly solution is to increase the bias current. To avoid having to increase the bias current, a differential structure has been proposed by B. Gilbert in U.S. Pat. No. 6,122,497. In this solution, the input signal and the output current are differential. The input current II[1], II[2], respectively, passes through T[1], T[2], respectively during its positive half cycle and through D[1], D[2], respectively during its negative half cycle. The transistors T[1] and T[2] constitute the conversion means while the diodes D[1] and D[2] constitute the regulation means for regulating the input impedance insofar as the current flowing in the diodes during the negative half cycle permits the input impedance of the conversion circuit to be defined during this negative half cycle. Current mirrors enable the current in the diodes to return to the output of the conversion circuit.

The invention takes into consideration a problem of the prior art according to which the input impedance drops on the two sides when the input power increases.

An object of the invention is to reduce the drop of the input impedance when the input power increases. As a result, the invention improves the linearity of the conversion circuit in terms of input impedance.

Indeed a circuit in accordance with the introductory paragraph is characterized according to the invention in that the regulation means include negative feedback means to control a regulating current taken from each component of the power signal as a function of the values of the potentials on the first and second common nodes.

Taking a regulating current from the components of the power signal permits the input impedance to be increased on the side of negative half cycle, whereas it diminishes on the side of the positive half cycle where the regulation only has slight influence on the value of the input impedance. As the functioning of the circuit is differential, the two phenomena compensate each other, leaving the overall impedance constant.

In advantageous embodiments, the conversion and regulation means are implemented with the aid of several transistors arranged in a manner described below with regard to which certain of these are looped to produce a negative feedback. In this case the negative feedback dynamically regulates the biasing of the conversion means so that the operating points are moved. This is preferably achieved by applying a negative feedback potential to a transistor that acts as a current generator. In a preferred embodiment the negative feedback means regulate the regulation current as a function of an average value of the potentials on the first and second common nodes. A common-mode negative feedback is therefore realized. The average value, the sum of the two components of the power signal divided by two, influences the negative feedback means to determine the regulating current.

When transistors are used, the use of a common mode voltage to generate a negative feedback permits the regulating current flowing in the transistors of the regulation means to be controlled. According to the invention, the impedance drops on the side of the positive half cycle and increases on the side of the negative half cycle. The differential input impedance being the sum of the two impedances, the two effects compensate each other and thus make it possible to prevent the drop in the impedance at high power.

Advantageous improvements are proposed in several advantageous embodiments of the invention to optimize the problems of noise. In practice this invention relates to all signal mixers in which a circuit according to the invention is used. Any mixer known as Gilbert type mixer indeed requires a conversion circuit. The mixers are used in signal processing apparatus in which frequency translations are performed: cordless telephones, DECT type telephones, mobile telephones, satellite receivers . . . The invention thus also relates to such signal processing apparatus, the signal being capable of being processed on reception, on transmission or at any time this is necessary.

In the same way the invention relates to apparatus to measure impedance and frequency using a conversion circuit according to the invention within a mixer or otherwise.

The invention will be described below with reference to the attached drawings among which:

IN THE DRAWINGS

Figure 2:
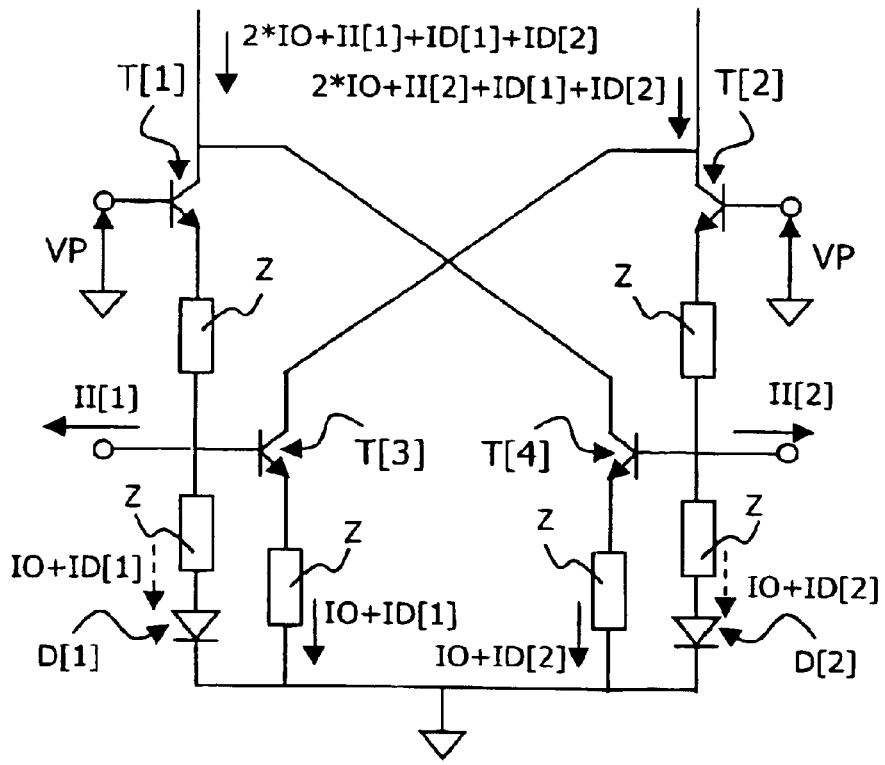
Figure 3:
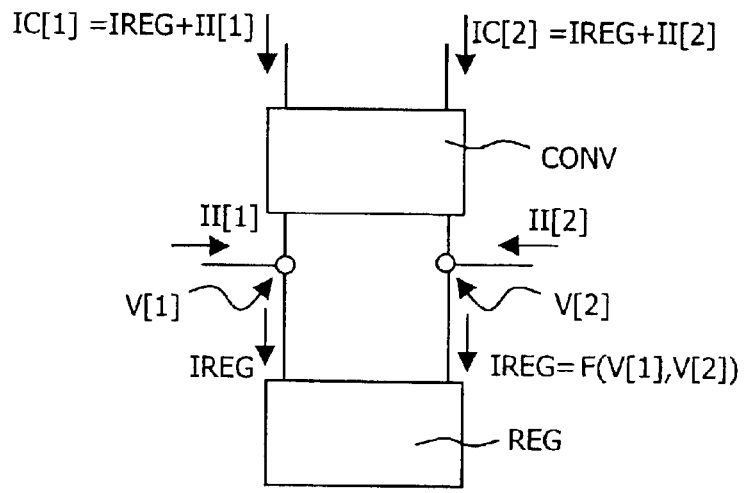
Figure 4:
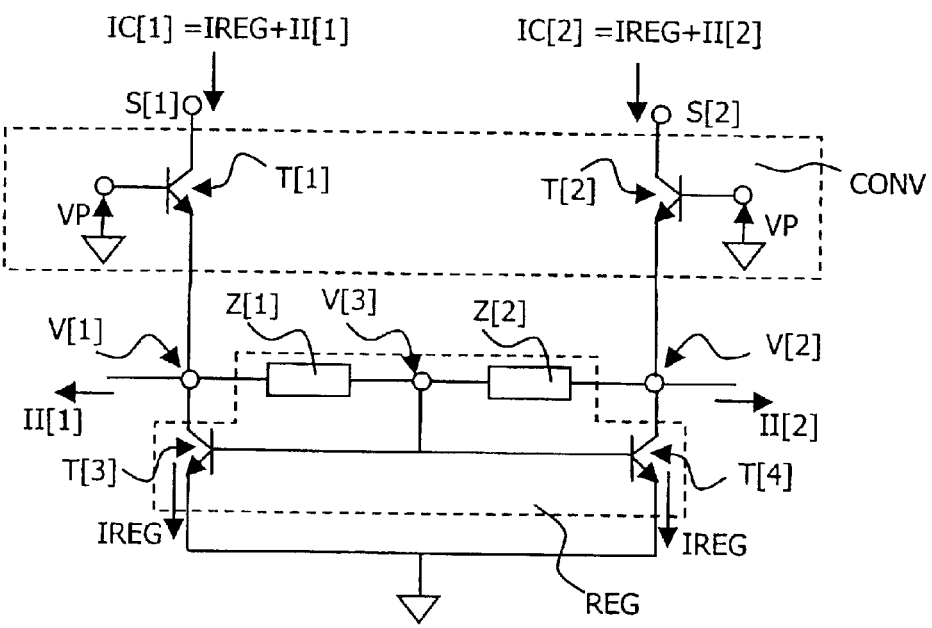
Figure 5:
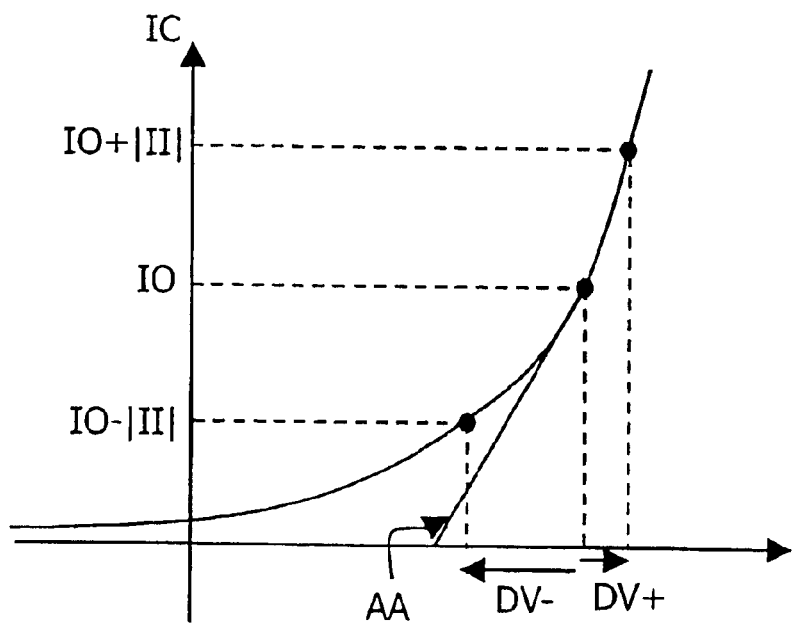
Figure 6:
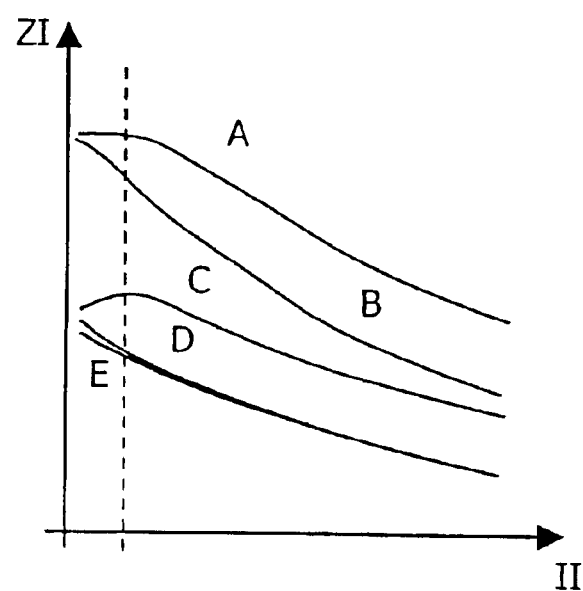
Figure 7:
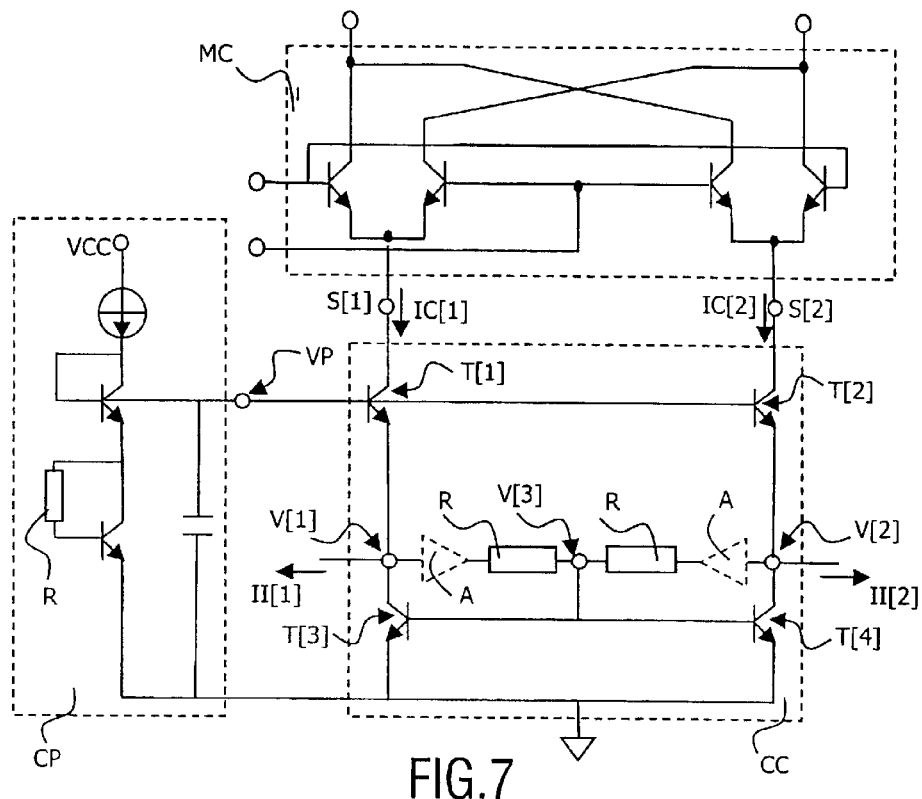
Figure 8:
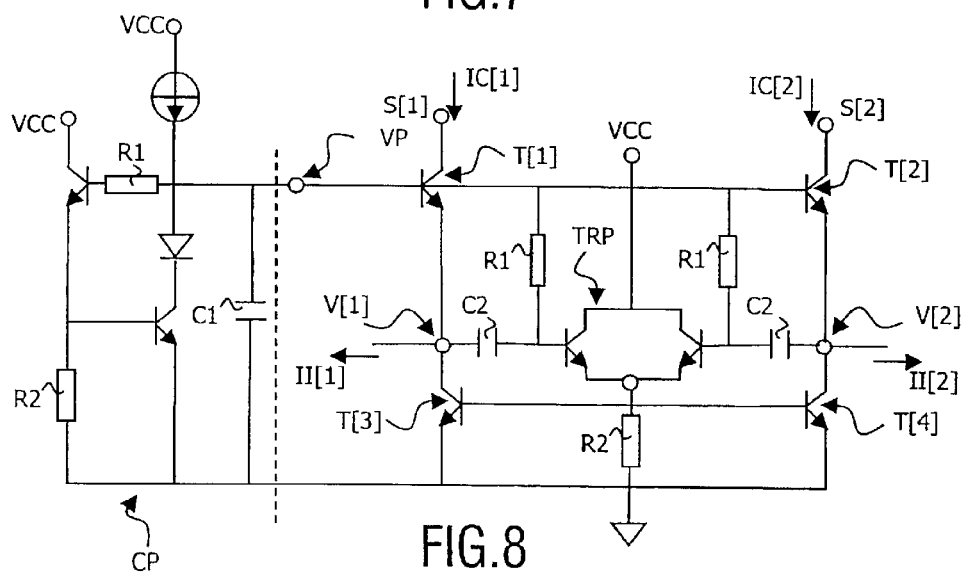
Figure 9:
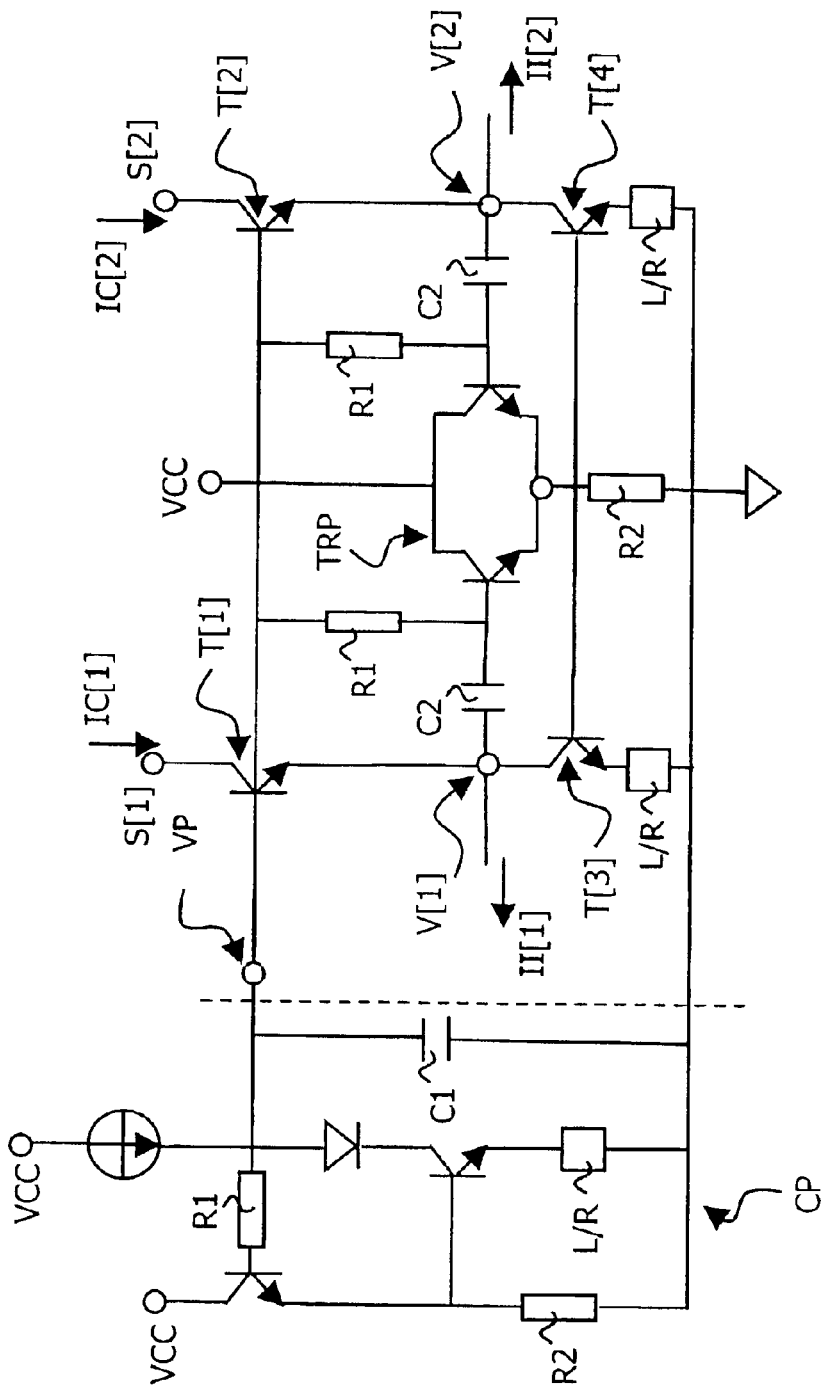

FIG. 1 is a schematic drawing of a conversion circuit as used in a standard manner, FIG. 2 is a schematic drawing of a conversion circuit as proposed in the prior art cited, FIG. 3 is a diagram of the invention, FIG. 4 is a schematic drawing of a conversion circuit according to a particularly simple embodiment of the invention, FIG. 5 is a bias diagram of a conversion cell illustrating the development of the input impedance, FIG. 6 provides a graphic comparison between the properties of a conversion cell according to the prior art and those of a cell according to the invention, FIGS. 7 to 9 are schematic drawings of improved embodiments of conversion cells according to the invention.

In integrated circuits the signal conveying data is either a voltage or a current. However, in many applications such as telecommunications, the input signal is a power. It is then necessary to transform the input power into current in order to be able to process the data. Thus a conversion circuit is useful for any type of circuit handling current. For example, circuits to measure power and circuits to measure impedance are such circuits. It is also especially the case with mixers, which perform frequency translations by using conversion circuits. One of the important characteristics of conversion circuits is their linearity, both with regard to power conversion and with regard to input impedance. Indeed the linearity of the input impedance ensures good adaptation of impedance permitting gain to be maximized and noise to be minimized. Thus, whatever the input power, the following properties are sought: constant input impedance whatever the supply, linear conversion, minimized noise. It is also certainly advantageous if the conversion circuit has low consumption.

FIG. 1 is a schematic drawing of a conversion circuit CC as used in a standard manner. A power source P is a voltage source V with a corresponding output impedance ZO. At the input of the conversion circuit, the voltage is referred to as VI and the current as II. The conversion circuit thus possesses a certain input impedance ZI=VI/II. To achieve proper functioning of the conversion, it is necessary that the input impedance is equal to ZO. In the case of such an adaptation of impedance where the input impedance is constant, a linear conversion is obtained. In the standard conversion cell CC given as an example, a transistor T is connected by a first branch to a fixed voltage VF, which can be zero, by a second branch to a common node itself connected, on the one hand, to a bias current source IO and, on the other hand, to a power source P through a resistor R. The third branch of the transistor constitutes the output of the conversion circuit. In this conversion circuit, the input impedance is defined by ZI=VI/II=R+1/GM, GM being the transconductance of the transistor T. However, GM is not linear. Indeed the relation between the base emitter voltage and the intensity in the collector is not linear as represented in FIG. 4 and the voltage on the emitter directly influences the value of II. According to FIG. 4, the value of IO, bias current, directly influences any possible excursion in intensity. Indeed, the greater the IO, the larger the approximately linear part around IO. In FIG. 4 will be observed that the problem of linearity is critical for the high levels of the absolute value of II, for which I-II lie in a non-linear part of the curve. Thus, if it is desirable to work with high input power, that is to say high II, it is necessary to increase the bias current to remain within the linear domain. This results in high consumption.

This problem has been circumvented by B. Gilbert, in the prior art patent cited, through a differential conversion circuit shown in FIG. 2. This cell requires the availability of a differential signal composed of two signals II[1] and II[2] which convey the data. In general a differential structure is used to take into account the negative half cycles of the high-power signal. However, we will see that the input impedance drops with such a structure. The two signals II[1] and II[2] are such that II[2]=−II[1]=−II for correct functioning of the conversion cell. Such differential signals originate from external circuits or blocks that precede the conversion circuit. The differential output current is the difference between the two output currents. With regard to the cell proposed by Gilbert, the differential output current is equal to 2II. In this solution the input current II[1], II[2], respectively passes partly through T[1], T[2] respectively, during its positive half cycle and through D[1], D[2], respectively and is reproduced by a current mirror during its negative half cycle. This is equivalent to connecting two circuits in parallel, for which the current passes through the one that has the lower impedance. To recover the output current when this is in its negative half cycle, current mirrors are used with the aid of the transistors T[3] and T[4] and the currents passing through these transistors are supplied on the output. In FIG. 5 the operation of this prior art is illustrated by the straight line AA, which replaces the bias curve of the transistor during the negative half cycle. A good linearity is indeed obtained. The assembly of the transistors T[3] and T[4] and diodes D[1] and D[2] provides the means to regulate the input impedance which permit the linearity of the impedance to be improved by proposing two paths for the input currents. However, because this improvement uses diodes and transistors, the conversion is still subject to the influence of nonlinear transconductance variations. Thus the input impedance drops on the two sides when the input power is increased due to the very structure of the transistors. As a result the impedance drops when the input power rises; this is unwanted at high power since this signifies that the impedance of the circuit is no longer matched to that of the input power source. This is illustrated in FIG. 6, which gives a comparison between the properties of a type of conversion circuit according to the prior art and according to the invention. Curve B represents the input impedance of the cell according to the prior art. It is noticeable that the input impedance drops when the power increases. FIG. 3 is a schematic drawing of the invention. The circuit thus includes conversion means CONV to convert the differential power signal into a differential current signal. The two components of the differential power signal are characterized by an intensity II[i] and a potential V[i] i=1 or 2. The conversion means are connected to the first and second outputs S[i] of the conversion circuit to supply the components of the differential output current IC[1] and IC[2] on the output of the circuit. The circuit also includes regulation means REG for regulating the input impedance of the circuit. According to the invention the regulation means include negative feedback means to control a regulating current taken from each component of the power signal as a function of the values of the potentials on the first and second common nodes, V[1] and V[2]. This is illustrated in FIG. 3 by the current IREG equal to a function F(V[1],V[2]) and extracted from II[1] and II[2] in order to regulate the conversion performed within the conversion means CONV. The taking of a regulating current from the components of the power signal permits the input impedance on the side of negative half cycle to be increased, whereas it diminishes on the side of positive half cycle where the regulation only has slight influence on the value of the input impedance. As the functioning of the circuit is differential, the two phenomena compensate each other, leaving the total impedance constant.

Advantageously, the negative feedback means use an average value of the two voltages on the first and second common nodes (V[1]+V[2])/2 to determine the part of the input signals that will be absorbed by the regulation means.

FIG. 4 shows an advantageous embodiment of a conversion circuit according to the invention. In the explanations II[1] will be considered positive and II[2]=−II[1]. As a result, the positive half cycle is located on the side of T[1] and the negative half cycle is located on the side of T[2]. It is recalled here that the power signal is generally an a.c. power signal. The conversion circuit for conversion of a differential signal composed of a first signal II[1] and a second signal II[2] into a differential output current composed of a first current IC[1] and a second current IC[2] has a first output S[1] supplying the first current IC[1] and a second output S[2] supplying the second current IC[2]. A first transistor T[1] has a first branch coupled to the first output S[1], a second branch coupled to a bias signal VP and a third branch coupled to a first common node where the voltage is referred to as V[1], and which receives the first signal II[1]. A second transistor T[2] has a first branch coupled to the second output S[2], a second branch coupled to a bias signal VP and a third branch coupled to a second common node where the voltage is referred to as V[2], and which receives the second signal II[2]. This is common to prior art. The bias signals VP are fixed signals designed to put the transistors into a desired operation area. In the invention the linearity of conversion is obtained by conversion and regulation means implemented with the aid of several transistors arranged in a manner close to that described in FIG. 4 for which certain of these transistors are looped to produce a negative feedback. In this case the negative feedback dynamically regulates the bias of the conversion means in such a way that the points of operation are moved. This is preferably achieved by applying a negative feedback potential to a transistor that acts as current generator.

More particularly, a preferred embodiment described in FIG. 4 uses common mode negative feedback. This negative feedback requires the evaluation of an average value between two values of potentials, then uses this average value to regulate the regulating current IREG. In practice the negative feedback is advantageously realized by means of a first regulation transistor T[3] having a first branch coupled to the first common node, a second branch coupled to a third common node where the voltage is referred to as V[3], common mode voltage, a third branch coupled to a reference voltage and a second regulation transistor T[4] having a first branch coupled to the second common node, a second branch coupled to the third common node, a third branch coupled to the reference voltage (ground for example). The third common node is coupled to the first and second common nodes in order to realize the negative feedback. In practice at least a first passive component Z[1] is coupled between the first and the third common node and at least a second passive component Z[2] is connected between the second and the third common node. When these passive components have the same characteristics, the common mode voltage [3] is the average value (V[1]+V[2])/2 between the two voltages V[1] and V[2]. The relative values of Z[1] and Z[2] permit the regulation to be adjusted. However, the circuit being otherwise symmetrical and the input signal generally an a.c. signal, it is advantageous if the common mode is such that Z[1]=Z[2]. In this case, when II increases, the voltage V[2] on the second common node rises much more quickly than the voltage V[1] on the first common node due to the non-linear voltage-current characteristic of the transistors (for example exponential in the case of bipolar transistors). For example in fact it can be seen in FIG. 5 that DV− is higher than DV+. It is observed that when the input signal is a power signal, a consequent modification is observed of the current II[2] (that is to say, here, on the side of the negative half cycle). Thus once V[2] has been detected to be different from −V[1], a correction follows triggered by a variation in the common mode voltage V[3] on the third common node. This voltage is used for negative feedback by connection to a branch of each of the transistors T[3] and T[4]. According to FIG. 4 the base of these transistors is effectively coupled to the third common node V[3] and the current IREG flowing in these transistors is therefore directly regulated by this negative feedback on the bases of these transistors. IREG is then equal to K(V[1],V[2])*IO+II. K being an artificial regulation coefficient as a function of the bias deviation induced by the negative feedback. This regulation coefficient will depend on the properties of the transistors T[3] and T[4]. The invention therefore uses the non-linearity itself to correct the input impedance. This correction only works if the idea of linearity is abandoned, that is to say with high power. In fact the invention permits to make a move on the curve of FIG. 5 while in the prior art another operation curve is attached to that of the transistors by putting two circuits in parallel. It is remarkable to note that the current IREG being the same on either side of the circuit, there is no influence on the differential output.

In the case of a standard conversion cell, that is to say without common mode negative feedback, when II increases, the current passing through T[2] diminishes equally fast as II until it reaches zero. The operation limit is situated at II=IO. In the graph of FIG. 5 a steep rise in impedance on the side of the negative half cycle is indeed obtained with a high II. With regard to the negative feedback, as the regulation increases (because V[3] increases) when II increases, the current in T[3] and T[4] also increases. Thus the negative half cycle of the input current II[2] is absorbed by T[4]. In this case T[2] remains biased in the case of a II well above IO and permits the input impedance to be maintained at the desired level. The improvement of linearity of the input impedance is due to the fact that when II increases, the input impedance on the side T[1] drops, because the intensity in T[1] rises, but that on the side of T[2] increases, because the intensity in T[2] diminishes. The differential impedance being the sum of the two impedances, the two effects offset each other, thus reducing the drop in impedance when the input power increases.

FIG. 6 shows a comparison between equivalent bias currents of the new structure and of that disclosed in U.S. Pat. No. 6,104,225. Equivalent bias here means that the bias voltage is generated in such a way that the input impedance is the same for both structures. In the circuits the voltages on the different nodes as well as the currents in the components are fixed by bias circuits to put the components into the desired operation area. The total consumption is identical for both structures. Curve A represents the differential input impedance of the new structure, curve B that of the prior art. Curve C is the input impedance observed during the negative half cycle, curve E, that observed during the positive half cycle with regard to the new structure proposed by the invention. Finally, curve D is the input impedance on one side of the prior art structure which is the same for positive and negative half cycles. It is noted that the drop of impedance being delayed during the negative half cycle by an initial rise followed by a reduction, the differential impedance of the total, which is the sum of curves C and E, drops less quickly. Thus with an equivalent bias current, the two structures have the same performance in terms of linearity of conversion but the new structure demonstrates better linearity in terms of input impedance.

FIG. 7 is a very simple embodiment of the invention for which the impedances Z[1] and Z[2] of FIG. 4 are resistors R and for which a conventional bias circuit CP is, connected to the conversion circuit to supply it with the bias voltage VP. The bias circuit is connected to a reference voltage VCC. FIG. 7 also describes a mixer according to the invention. A signal mixer of this kind comprises an input stage CC including at least one conversion circuit as described above, a mixing stage MC and a bias stage CP feeding a bias signal VP to the input stage CC, the input stage CC receiving a differential input signal II[1] and II[2] and having a first output S[1] supplying a first current IC[1] to a first input of the mixing stage MC and a second output S[2] supplying a second current IC[2] to a second input of the mixing stage MC. In this embodiment there is a differential noise which appears in the differential output signals. Indeed the resistors R used to sample the common mode inject noise into the differential inputs of the circuit which convey II[1] and II[2]. This noise is kept on the differential output. It may also be advantageous to minimize the noise in, the negative feedback. Amplifiers A can simply be added in the circuit of FIG. 4 between the resistors R and the first and second common nodes. These amplifiers permit to isolate the resistor from the input of the conversion circuit, that is to say from the first and second common nodes. These amplifiers are optional and are therefore marked by dotted lines in FIG. 4. On the other hand, the embodiments in FIGS. 8 and 9 are proposed. In terms of noise, providing the common mode using a pair of transistors TRP is an advantageous solution. In FIGS. 8 and 9, the bias circuits CP are adapted as a function of the conversion circuit: they supply the transistors of the conversion circuit with the bias necessary for correct operation, based on a reference voltage VCC. This adaptation is known to the person skilled in the art. The resistors R1 permit the d.c. potential of the bases of the transistors to be fixed, the elements R1 and C2 to form high-pass filters whose inputs are the differential inputs and the output the base of the transistors. R2 serves to fix the current through the transistors of the pair. In continuous operation the bases of the transistors are thus connected to the bias voltage and in frequential operation (frequency of the input signals) they are connected to the differential inputs because the capacitor C2 behaves as a short circuit in high frequency and as an open circuit in continuous operation. The greater part of the noise is then injected into the third common node and therefore to the base of the transistors T[3] and T[4] of the regulation means. The noise therefore does not appear in the output in differential mode. The elements cited to minimize noise: amplifier, transistor, capacitor can be used alone or in combination.

FIG. 9 proposes that an inductance-resistance degeneration L/R be applied, again permitting the noise of the transistors to be minimized according to concepts known to a person skilled in the art. The drawings provided relate to individual embodiments of the invention. Although this invention has been described in accordance with the embodiments presented, a person skilled in the art will immediately recognize that there are variants to these embodiments and that these variants remain within the spirit and scope of this invention. There are numerous ways to use the invention and numerous modifications can be made by a person skilled in the art without in any way departing from the spirit and scope defined by the following claims.

What is claimed is:

1. A conversion circuit for converting a differential power signal composed of a first signal supplied on a first common node and a second signal supplied on a second common node, into a differential output current composed of a first and a second current, said circuit having a first output supplying the first current and a second output supplying the second current, comprising:

conversion means for converting the first and second signal into the first and second current respectively, said conversion means being connected to the first and second outputs of the conversion circuit, and said conversion means comprising a first conversion transistor having a first branch coupled to the first output, a second branch coupled to a bias signal and a third branch coupled to the first common node to receive the first signal, and a second conversion transistor having a first branch coupled to the second output, a second branch coupled to the bias signal and a third branch coupled to the second common node to receive the second signal; and regulation means for regulating the input impedance of the circuit, said regulation means being connected to the conversion means, wherein the regulation means includes negative feedback means to control a regulating current taken from each component of the power signal as a function of the values of the potentials on the first and second common nodes.

2. A conversion circuit as claimed in claim 1, characterized in that the negative feedback means regulates the regulating current as a function of an average value of the potentials on the first and second common nodes.

3. A conversion circuit as claimed in claim 1, characterized in that the regulation means includes a first regulation transistor having a first branch coupled to the first common node, a second branch coupled to a third common node, a third branch coupled to a reference voltage, a second regulation transistor having a first branch coupled to the second common node, a second branch coupled to the third common node, a third branch coupled to the reference voltage, the third common node being connected to each of the first and second common nodes to produce the negative feedback.

4. A conversion circuit as claimed in claim 3, characterized in that the connections between the third and first common nodes and between the third and second common nodes include elements designed to minimize the noise in these connections.

5. A conversion circuit as claimed in claim 3, characterized in that the elements designed to reduce the noise in these connections are selected from the following elements: amplifier, transistor, capacitor, alone or in combination.

6. A conversion circuit as claimed in claim 3, characterized in that inductance and/or resistance degeneration is performed on the first and second regulation transistors.

7. A signal mixer including an input stage, a mixing stage and a bias stage applying a bias signal to the input stage, the input stage receiving a differential input signal and having a first output applying a first current to a first input of the mixing stage and a second output applying a second current to a second input of the mixing stage, characterized in that the input stage includes a conversion circuit as claimed in claim 1.

8. A signal processing apparatus including at least a signal mixer as claimed in claim 7.

9. A signal receiver including a signal processing apparatus as claimed in claim 7.

* * * * *